United States Patent
Harvey et al.

(10) Patent No.: US 6,215,129 B1
(45) Date of Patent: *Apr. 10, 2001

(54) VIA ALIGNMENT, ETCH COMPLETION, AND CRITICAL DIMENSION MEASUREMENT METHOD AND STRUCTURE

(75) Inventors: Ian Robert Harvey, Kaysville, UT (US); Satyendra Sethi, Pleasanton, CA (US)

(73) Assignee: VSLI Technology, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/984,483

(22) Filed: Dec. 1, 1997

(51) Int. Cl.[7] .................. H01L 23/58; H01L 23/544; H01L 23/48; H01L 23/52
(52) U.S. Cl. ..................... 257/48; 257/797; 257/758; 438/14
(58) Field of Search .................. 257/348, 503, 257/797, 758, 760–766; 438/14

(56) References Cited

U.S. PATENT DOCUMENTS

| | | | |
|---|---|---|---|
| 4,642,672 | * 2/1987 | Kitakata | 257/797 |
| 5,457,334 | * 10/1995 | Nishimoto | 257/306 |
| 5,736,863 | * 4/1998 | Liu | 324/765 |
| 5,780,870 | * 7/1998 | Maeda et al. | 257/48 |
| 5,847,466 | * 12/1998 | Ito et al. | 257/775 |
| 5,856,705 | * 1/1999 | Ting | 257/758 |
| 5,869,877 | * 2/1999 | Patrick et al. | 257/429 |
| 5,900,672 | * 5/1999 | Chan et al. | 257/751 |

* cited by examiner

Primary Examiner—Eddie C. Lee
Assistant Examiner—Allan R. Wilson
(74) Attorney, Agent, or Firm—Wagner, Murabito & Hao LLP

(57) ABSTRACT

A test device and method for determining parameters of a plurality of vias formed into a dielectric material making contact to a buried conductive layer. The present invention is comprised of a sample structure disposed within the material through which a plurality of vias are to be formed. The sample structure is adapted to enhance secondary electron yield from the via bottom during a scanning electron microscope examination of the vias. Additionally, the plurality of vias to be formed are disposed intentionally offset with respect to the sample structure. As a result, the enhanced secondary electron yield from the sample structure characterizes the degree of misalignment present in the via formation process. In so doing, the present invention simultaneously quantifies the critical dimension of the vias, the alignment/registration of the via formation process, and determines whether or not the vias are etched to a minimum desired depth.

6 Claims, 9 Drawing Sheets

VIA ALIGNMENT, ETCH COMPLETION, AND CRITICAL DIMENSION MEASUREMENT METHOD AND STRUCTURE

TECHNICAL FIELD

The present claimed invention relates to the field of semiconductor devices. More specifically, the present claimed invention relates to the manufacturing of semiconductor devices.

BACKGROUND ART

As semiconductor processing and fabrication techniques improve, the size of various semiconductor features is reduced. This reduction in size, in turn, allows for the advantageous placement of a greater number of semiconductor devices in a given area. Unfortunately, such reduction in the size of various semiconductor features is not without drawbacks.

One example of a drawback associated with the reduction in size of semiconductor features is found in the area of via inspection. Specifically, as the critical dimension (i.e. the diameter as measured at the bottom of the via) becomes smaller than approximately 0.6 microns, conventional optical inspection is not a feasible method for measuring the critical dimension of the via. Thus, when the critical dimension of a via is less than approximately 0.6 microns a scanning electron microscope examination of the via is required.

With reference now to Prior Art FIG. 1, a side sectional view of a dielectric material 100 having a via 102 formed therein is shown. During a scanning electron microscope examination of via 102, secondary electrons (typically represented by arrows 104 and 106 are generated. Unfortunately, during conventional via examination processes, such secondary electrons 104 and 106 are often absorbed by the material through which the via is formed. As a result, detector 108 does not receive (i.e. detect) secondary electrons 104 and 106. Thus, a conventional scanning electron microscope examination of the via does not always provide an accurate measurement of the via's critical dimension.

As yet another drawback, conventional via examination processes (e.g. optical inspection and scanning electron microscope examination) do not readily provide information on various other parameters of the via being examined. For example, conventional scanning electron microscope examination processes do not readily indicate the depth to which the via has been etched into an underlying material. As a result, in conventional via examination processes, it is not easy to determine if a via extends deep enough into the underlying material. That is, it is difficult to determine if the via "cleared" the depth necessary to ensure that the via opens to the underlying conductive layer. Most commonly, this information is not available until the device is completed and passes electrical tests.

As still another drawback associated with conventional via inspection methods, such prior art approaches do not provide information on the alignment/registration of the via mask. That is, conventional approaches do not readily provide information on the difference between the actual location of a via and the intended location of the via. Therefore, conventional methods require a separate and distinct measurement process to determine the degree of misalignment present in the formation of the vias, or more commonly, the information is not obtained at all.

Thus, a need exists for an apparatus and method for measuring the critical dimension of a via wherein the apparatus and method is feasible even for a via having a critical dimension of less than approximately 0.6 microns. A further need exists for a via formation apparatus and method which readily indicates whether a via has been formed to a desired depth into the underlying dielectric material. Still a further need exists for an apparatus and method which determines the degree of misalignment present in the formation via patterning process.

DISCLOSURE OF THE INVENTION

The present invention provides an apparatus and method for measuring the critical dimension of a via wherein the apparatus and method is feasible even for a via having a critical dimension of less than approximately 0.6 microns. The present invention also provides a via formation apparatus and method which readily indicates whether a via has been formed to a desired depth into the underlying dielectric material. The present invention further provides an apparatus and method which determines the degree of misalignment present in the formation of a via.

Specifically, in one embodiment, the present invention is comprised of a sample structure disposed within the material through which a plurality of vias are to be formed. The sample structure is adapted to repel secondary electrons which are generated during a scanning electron microscope examination of the vias. This facilitates SEM imaging of the bottom of the via hole. In the present embodiment, the sample structure is disposed within the material through which the plurality of vias are to be formed such that the top surface of the conductive, but electrically isolated (floating ground) sample structure is disposed at a depth which is at least as great as the intended depth of the plurality of vias. Additionally, in the present embodiment, the plurality of vias to be formed are disposed intentionally offset with respect to the sample conductive structure. As a result, the secondary electrons, which are imaged from the conductive surface at the bottom of the via hole, characterize the degree of misalignment present in the via formation process. In so doing, the present invention provides information regarding the critical dimension of the vias (diameter) and the alignment/registration of the via formation process, and determines whether or not the vias are etched to a desired depth, all at the same time.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

The drawings referred to in this description should be understood as not being drawn to scale except if specifically noted.

BEST MODE FOR CARRYING OUT THE INVENTION.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
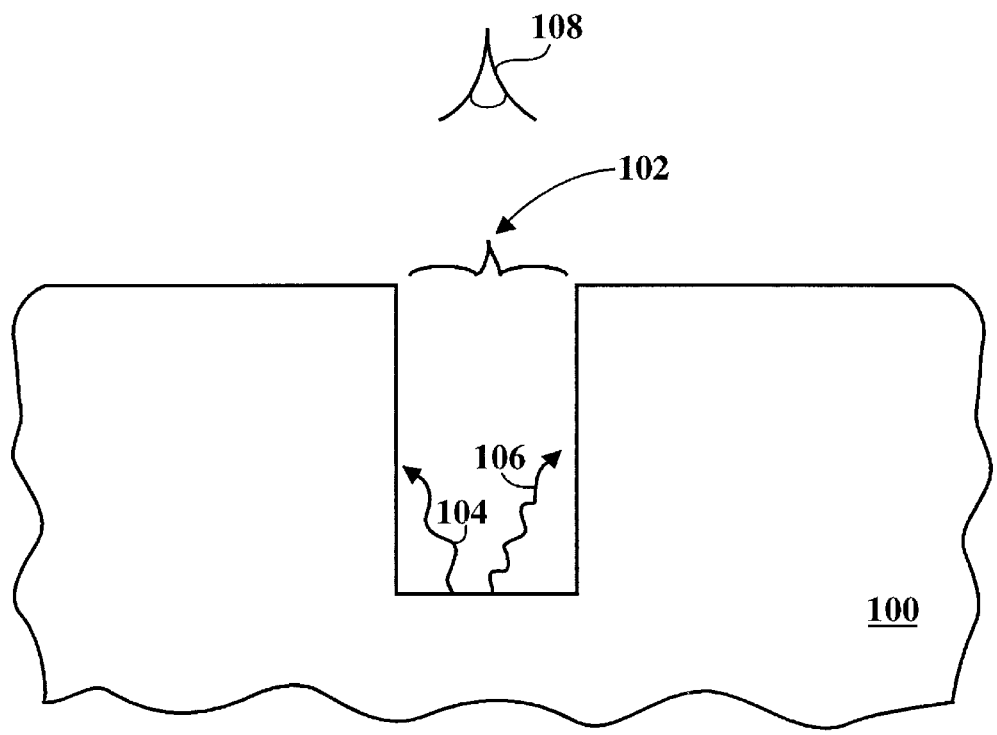
FIG. 1 is a side sectional view of a dielectric material having a via formed therein.
Figure 2:
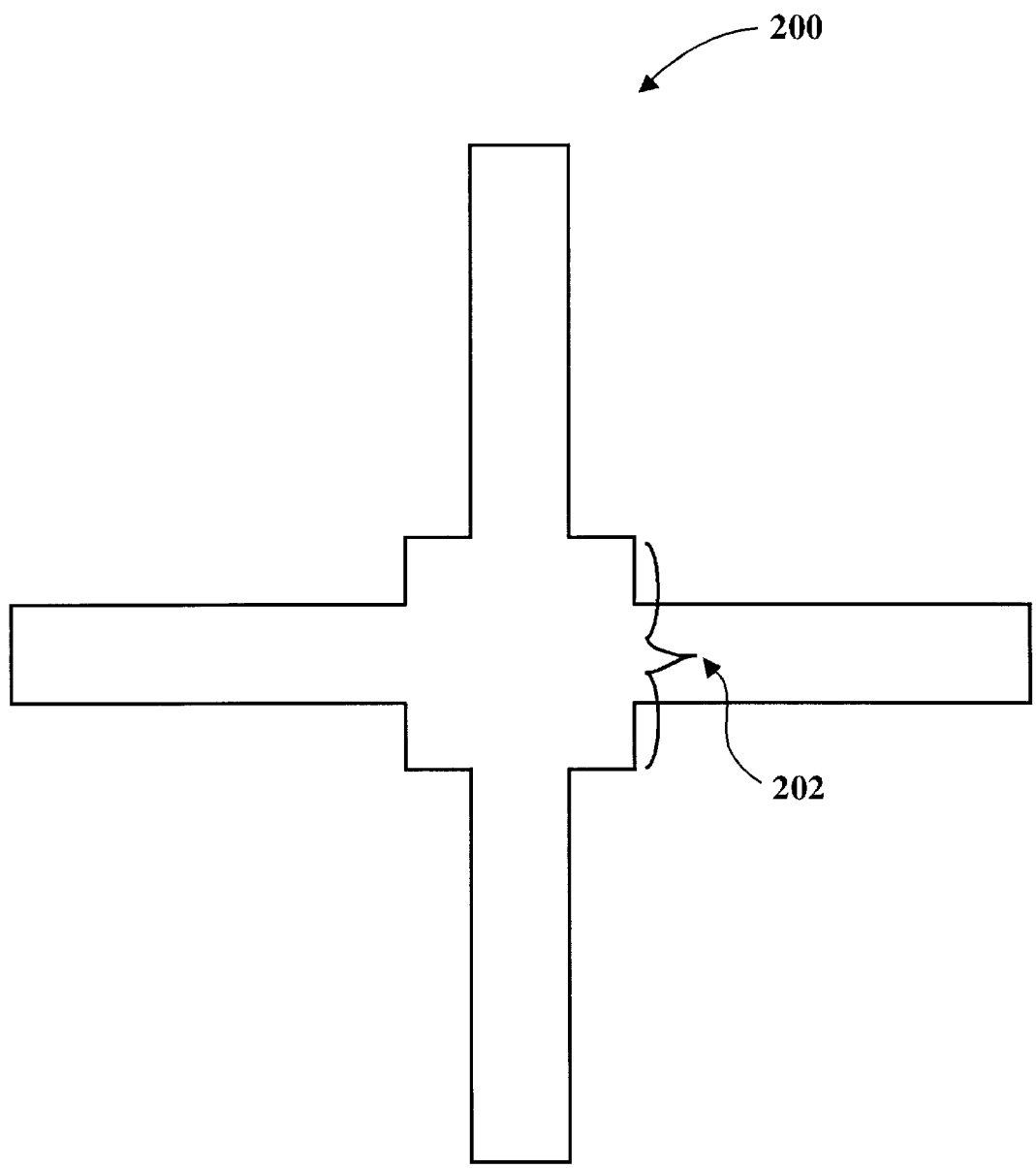
FIG. 2 is top plan view of a sample conductive structure buried in accordance with the present claimed invention.

With reference now to FIG. 2, a top plan view of a sample conductive structure formed in accordance with the present claimed invention is shown. In the present embodiment, sample structure 200 is a cross-shaped conductor which is formed within the material (e.g. silicon dioxide) into which the via is to be formed. Ultimately the via will serve as a vertical conductive path to a higher conductive layer. Thus, sample structure 200 of the present invention is used as a test device to assist in examining the parameters of test vias, and is disposed, for example, on a semiconductor wafer, at a location where such a test device would be desired. In the present embodiment, sample structure 200 is formed using well-known and widely-used material deposition techniques for conductive materials. Sample structure 200 is formed within the dielectric material into which the via is to be formed such that sample structure 200 is electrically isolated. That is, in the present embodiment sample structure 200 is electrically "floating" relative to ground potential. Also, sample structure 200 is further disposed within the dielectric such that a test via can be formed into the dielectric, and sample structure 200 will be exposed at the bottom of the test via. More specifically, sample structure 200 is disposed within the dielectric material through which the via is to be formed such that the top surface of sample structure 200 is disposed at a depth which is at least as great as the intended depth of the via. Vias formed over this test structure will be representative of vias formed over active devices.

With reference still to FIG. 2, in the present embodiment, sample structure 200 is comprised of one or more layers of material which are metallic in nature and which increase secondary electron yield from the bottom of the via during a scanning electron microscope examination. That is, sample structure 200 is comprised of a material which will accumulate electrons during a scanning electron microscope examination and thereby acquire a negative net charge. The accumulated negative net charge repels secondary electrons generated during the scanning electron imaging microscope process. In so doing, the present invention inhibits absorption within the via and repels the secondary electrons from the via. As a result, more of the secondary electrons will be received by the detector used in the scanning electron microscope examination. Therefore, an improved image of the via bottom is obtained during the scanning electron microscope examination.

Figure 3:
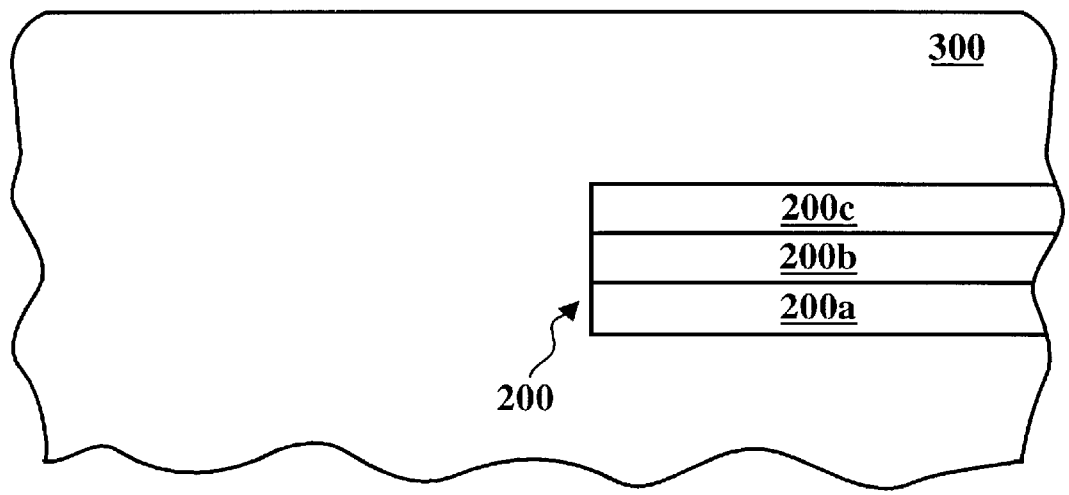
FIG. 3 is a side sectional view of a dielectric material having the present test device (i.e. the sample conductive structure of FIG. 2) formed therein in accordance with the present claimed invention.

With reference now to FIG. 3, a side sectional view of a dielectric 300 having the present test device (i.e. sample structure 200) formed therein is shown. FIG. 3 illustrates, as mentioned above, that in the present embodiment, sample structure 200 is comprised of at least one, and perhaps multiple layers of conductive material. In the embodiment of FIG. 3, sample structure 200 is comprised of a bottom layer 200a of titanium nitride, a middle layer 200b of an aluminum and copper alloy, and a top layer 200c, of titanium nitride. Although such materials are recited in the present embodiment, it will be understood that the present invention is well suited to the use of various other materials and combinations of electrically floating (or isolated) conductive materials which will accumulate a net negative charge under electron bombardment, and thereby repel secondary electrons during a scanning electron microscope examination.

Figure 4:
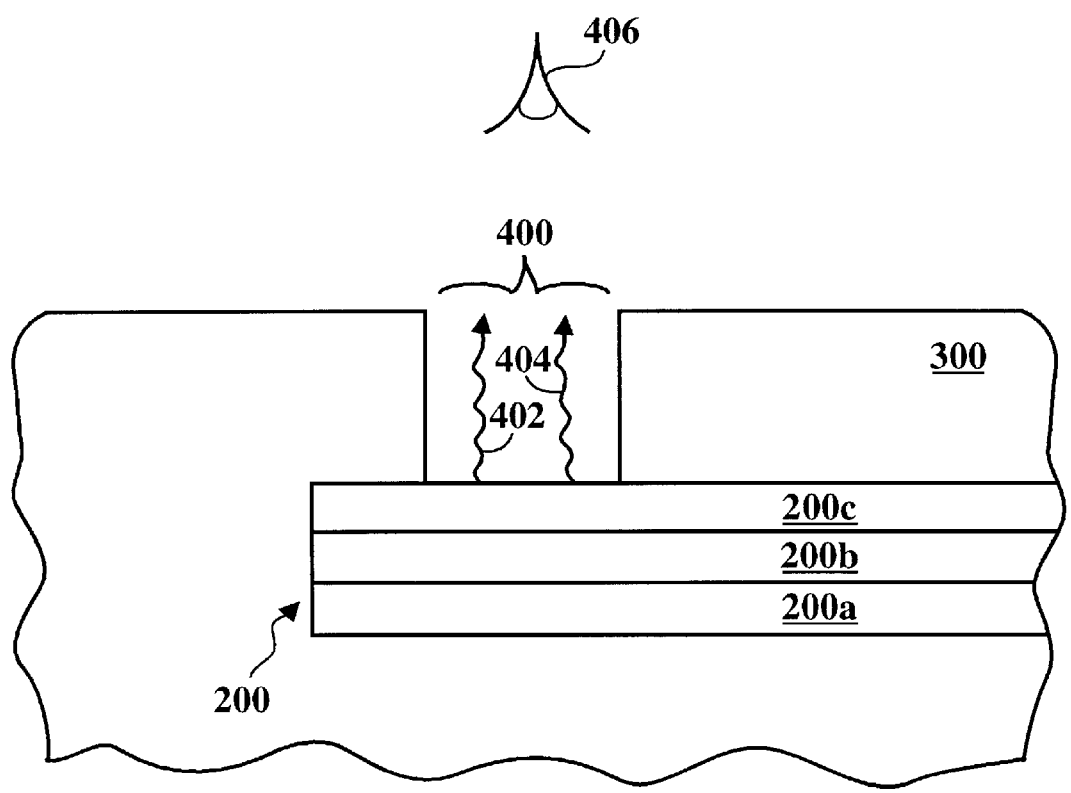
FIG. 4 is a side sectional view of the dielectric (300) and present test device of FIG. 3 with a via formed into the dielectric material in accordance with the present claimed invention.

With reference next to FIG. 4, a side sectional view of a dielectric material 300 having the present test device (i.e. sample structure 200) and a via 400 formed therein is shown. As shown in FIG. 4, sample structure 200 has been formed in a location such that it will underlie a test via 400. In the embodiment of FIG. 4, sample structure 200 resides along the entire bottom surface of test via 400. During a scanning electron microscope examination, sample structure 200 accumulates a net negative charge under electron bombardment, and will as a consequence repel secondary electrons, typically shown as 402 and 404, away from sample structure 200. As a result, the present invention increases the number (yield) of secondary electrons which reach detector 406. In so doing, the present invention provides an enhanced (bright) scanning electron microscope image of via 400. The enhanced scanning electron microscope image makes it possible to measure the diameter of the bottom of via 400. As yet another benefit, sample structure 200 of the present invention repels secondary electrons from a via, even when the via has a critical dimension of less than 0.6 microns. That is, the present invention provides for accurate measurement of the critical dimension of a via even when the via has a critical dimension of less than approximately 0.6 microns, and an aspect ratio (depth-to-diameter) 1 greater than one-to-one.

With reference still to FIG. 4, in this embodiment, the present invention clearly illustrates whether or not the via has been etched to the desired depth. That is, in the present embodiment, sample structure 200 has been formed within dielectric material 300 such that the top surface of sample structure 200 is at the same depth as the intended depth of the bottom of via 400. During a scanning electron microscope examination of via 400, if the top surface of structure 200 is exposed (due to the via being etched to a depth at least equal to the depth at which the top surface sample structure 200 is located), the present invention will provide a more intense image of the bottom of via 400. Thus, if the scanning electron microscope image is dark, then via 400 has not been etched to the desired depth (a depth at least as deep as the depth at which the top surface of structure 200 resides). Therefore, the present invention readily indicates whether a via has been formed to a desired depth into the underlying dielectric material.

Figure 5:
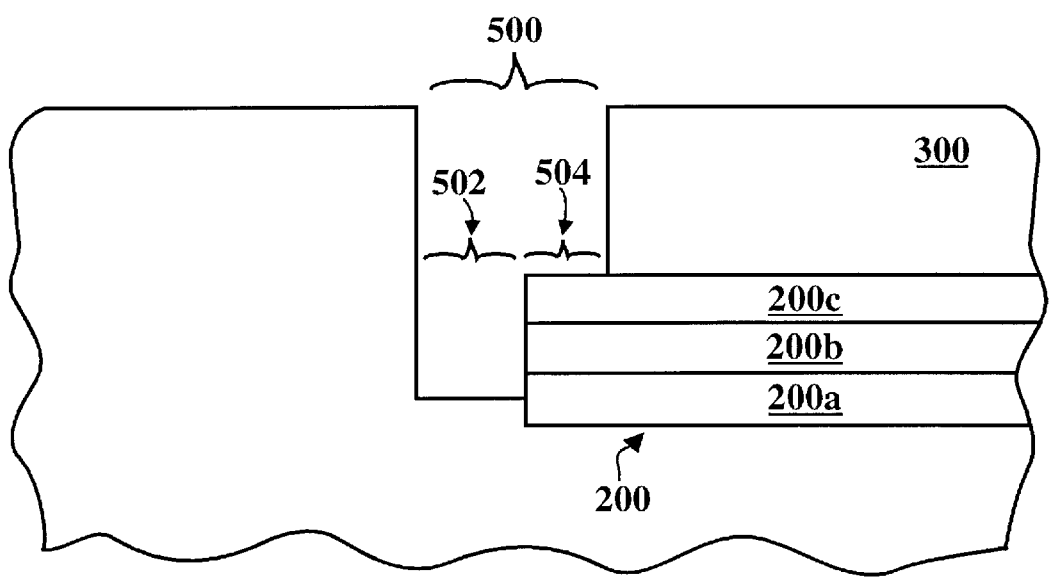
FIG. 5 is a side sectional view of the dielectric material and present test device of FIG. 3 with a via formed into the dielectric, mis-aligned so as to partially overlie the conductive layer in accordance with the present claimed invention.

With reference next to FIG. 5, a side sectional view of a dielectric 300 having the present test device (i.e. sample structure 200) and another via 500 formed therein is shown. As shown in FIG. 5, at least a portion of sample structure 200 has been formed in a location such that it will underlie test via 500. This via is said to be mis-aligned or "unlanded". In the embodiment of FIG. 5, sample structure 200 resides along only a portion of the bottom surface of test via 500, and via 500 extends into dielectric 300 deeper than the top surface of sample structure 200. As described in conjunction with the embodiment of FIG. 4, during a scanning electron microscope examination, sample structure 200 of the present embodiment accumulates a net negative charge, and thereby repels secondary electrons away from sample structure 200. As a result, the present invention increases the number of secondary electrons which reach the detector of the scanning electron microscope (e.g. detector 406 of FIG. 4). In so doing, the present invention provides an enhanced scanning electron microscope image of via 500. In this embodiment, the present invention even more clearly indicates whether or not the via has been etched to the desired depth. More specifically, when sample structure 200 is disposed as shown in FIG. 5, a scanning electron microscope examination of via 500 will produce a much brighter image along that area of via 500 into which sample structure 200 extends. Thus, a difference in the intensity between area 502 (dark) and area 504 (bright) of via 500 will appear in the scanning electron microscope image of via 500. Such a contrast in the image intensity clearly indicates that via 500 has been etched to at least the desired depth.

Figure 6:
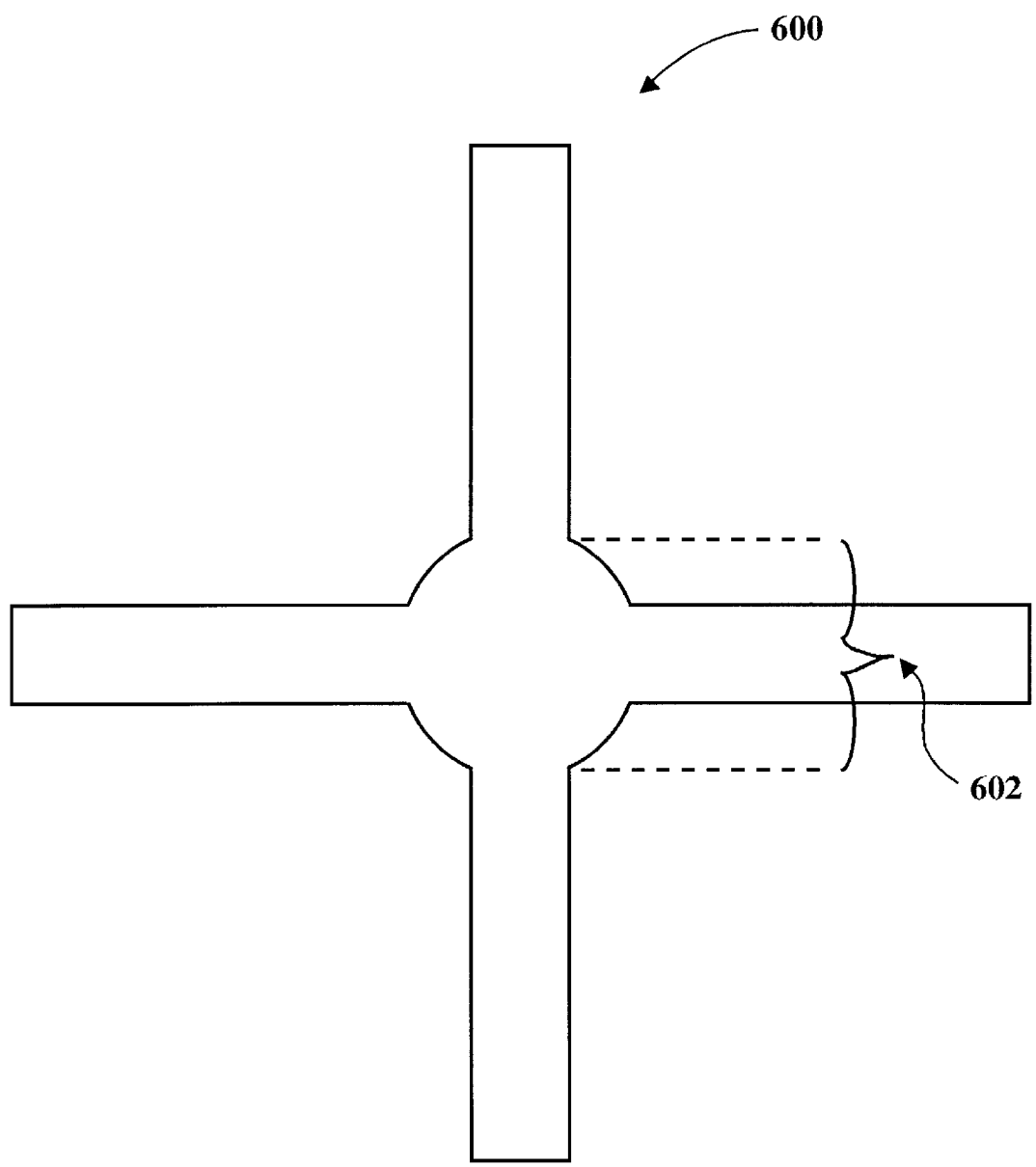
FIG. 6 is top plan view of another sample structure in accordance with the present claimed invention.

With reference now to FIG. 6, a top plan view of another embodiment of a sample structure 600 formed in accordance with the present claimed invention is shown. As in the embodiment of FIG. 2, sample structure 600 of the present embodiment is a cross-shaped test device which is formed within the material (e.g. silicon dioxide) into which the via is to be formed. Thus, sample structure 600 of the present invention is used as a test device to assist in examining the parameters of test vias, and is disposed, for example, on a semiconductor wafer, at a location where such a test device would be desired. In the present embodiment, sample structure 600, like sample structure 200 is formed using well-known and widely-used material deposition techniques. Sample structure 600 is formed within the material into which the via is to be formed such that sample structure 600 is electrically isolated. Also, sample structure 600 is further disposed within the dielectric material such that a test via can be formed into the dielectric material, and at least a portion of sample structure 600 will be exposed at the bottom of the test via. More specifically, sample structure 600 is disposed within the dielectric material through which the via is to be formed such that the top surface of sample structure 600 is disposed at a depth which is at least as great as the intended depth of the via.

Figure 7:
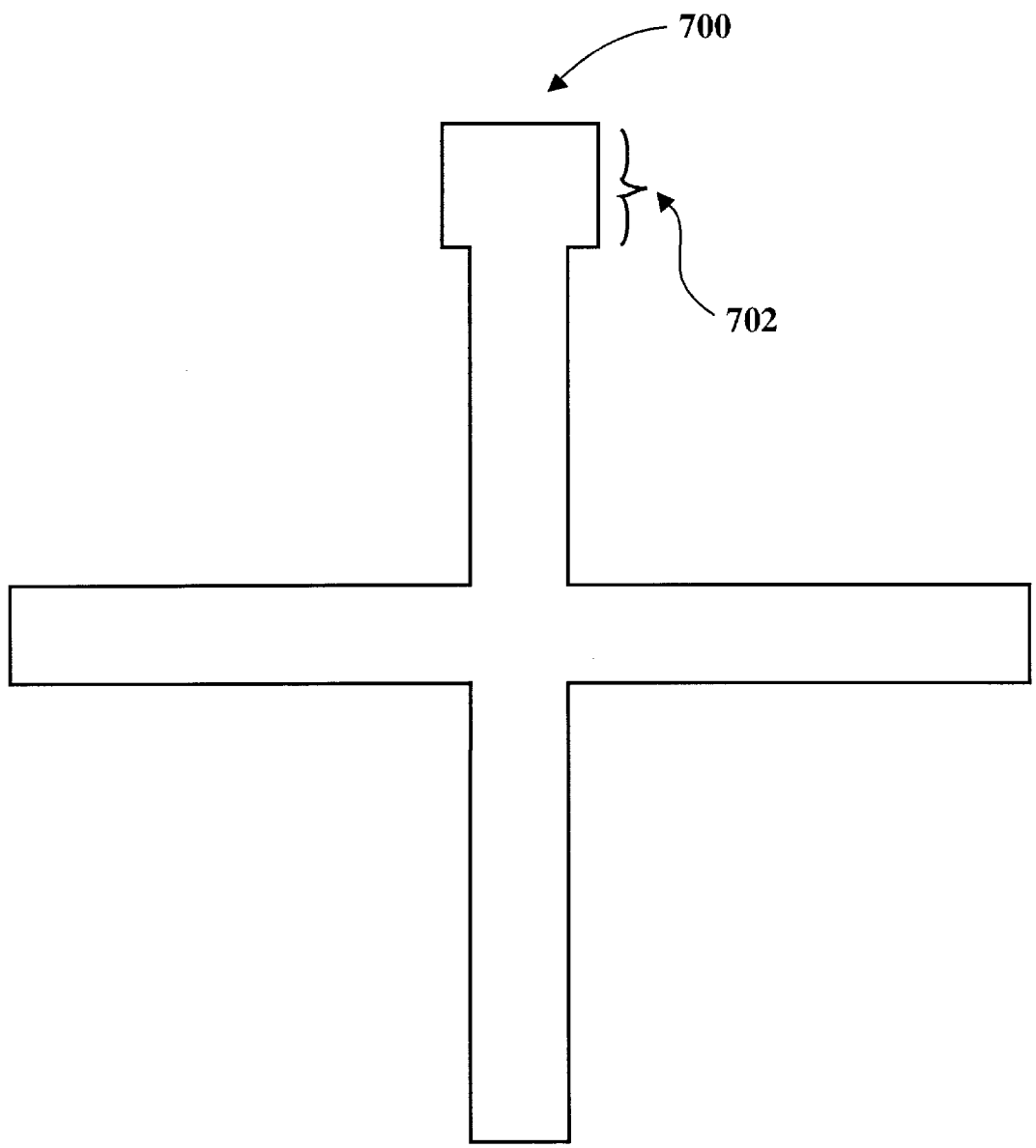
FIG. 7 is top plan view of yet another sample structure in accordance with the present claimed invention.

Still another configuration of the sample structure of the present invention is shown in FIG. 7. Although such sample structure configurations are shown in FIGS. 2, 6, and 7, it will be understood that these sample structure configurations are exemplary. That is, the sample structure of the present invention is well suited to having numerous other configuration, shapes, and designs.

Figure 8:
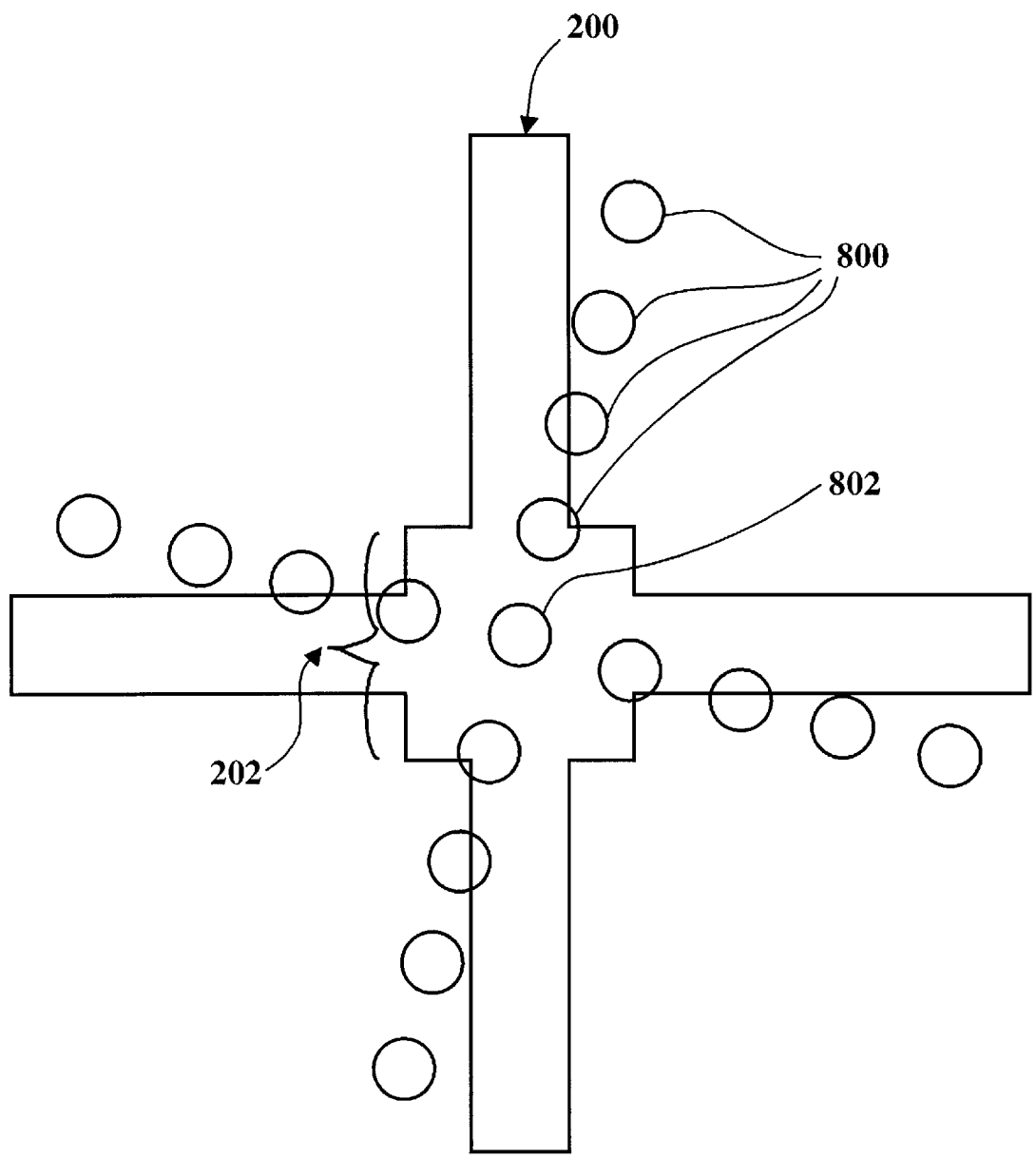
FIG. 8 is top plan view of the sample structure of FIG. 2 having a plurality of vias formed thereover in accordance with the present claimed invention.

With reference now to FIG. 8, a top plan view of the sample structure of FIG. 2 is shown having a plurality of vias disposed thereover. In FIG. 8, each of the circles, typically shown as 800, represents the location where a test via is to be formed. As shown in FIG. 8, in the present embodiment, sample structure 200 includes a portion 202 having a diameter, i.e. a size, which is greater than the diameter (or size) of the test vias by an amount at least equivalent to the greatest allowed misalignment of the design rules. (Portion 202 is also shown in FIG. 2.) In so doing, the present embodiment ensures that sample structure 200 will completely underlie a via (e.g. via 802) located over portion 202. Thus, because sample structure 200 completely underlies the entire bottom of via 802, the present invention provides an enhanced scanning electron microscope image of via 802. The enhanced scanning electron microscope image provides a more accurate measurement of the critical dimension of via 802. Thus, in the present invention, the portion (e.g. portion 202) of the sample structure which has a diameter greater than the diameter of the test via is used to enhance the measurement of the critical dimension of the test via, simultaneously, while the test structure is under "charge" by electron beam bombardment.

With reference still to FIG. 8, the plurality of vias are disposed offset by known, designed increments with respect to sample structure 200. That is, the farther vias 800 are located from portion 202 of sample structure 200, the more vias 800 are mis-aligned with respect sample structure 200. In the present invention the misalignment is intentional and the degree of the misalignment is known. For example, in the present embodiment, the degree of the misalignment is selected such that, under ideal registration conditions, the third via in any direction from via 802 will still partially overlie sample structure 200, but the fourth via in any direction from via 802 will no longer overlie sample structure 200. After determining the aforementioned degree of misalignment, a user of the present invention then performs a scanning electron microscope examination of the vias to ensure that such a relationship exists between vias 800 and sample structure 200. If the scanning microscope examination indicates that vias 800 are disposed where intended, then the via location and formation process is accurately registered. That is, in such an instance, the via location and formation process does not suffer from a substantial degree of misalignment. However, if, for example, the second via in any direction from via 802 did not overlie sample structure 200, then the present invention would clearly indicate that the via location and formation process does suffer from a substantial and quantifiable degree of misalignment.

Thus, the present invention allows one to readily measure the critical dimension (by examining via 802, for example); readily determine whether the via has been etched to a desired depth (by contrast effects of unlanded vias, for example); and readily determine whether or not the via patterning process is accurately locating the vias as intended (by noting which vias are offset, for example).

Figure 9:
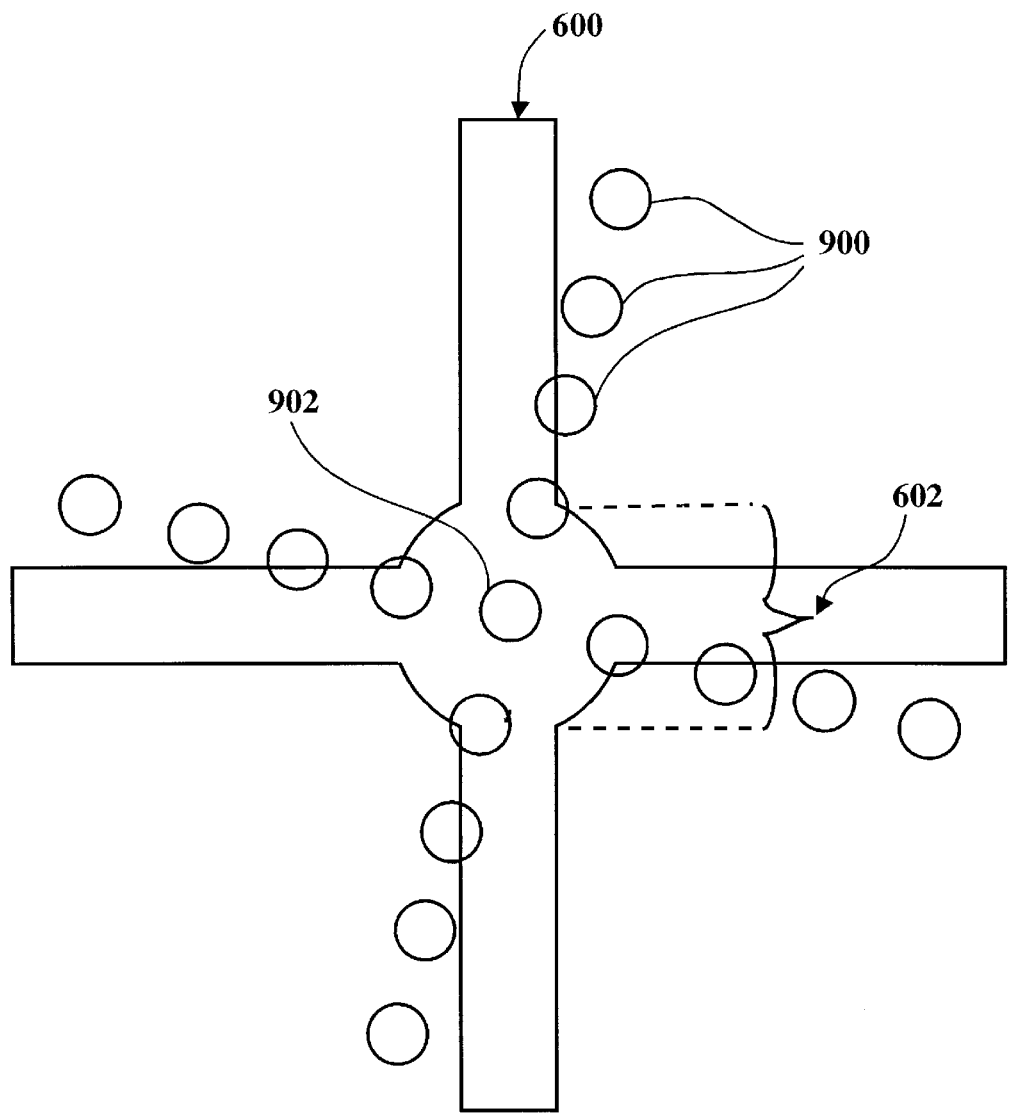
FIG. 9 is top plan view of the sample structure of FIG. 7 having a plurality of vias formed thereover in accordance with the present claimed invention.

With reference now to FIG. 9, a top plan view of the sample structure of FIG. 6 is shown having a plurality of vias disposed thereover. In FIG. 9, each of the circles, typically shown as 900, represents the location where a test via is to be formed. As shown in FIG. 9, in the present embodiment, sample structure 600 includes a portion 602 having a diameter greater than the diameter of the test vias. (Portion 602 is also shown in FIG. 6.) In so doing, the present embodiment ensures that sample structure 600 will completely underlie a via (e.g. via 902) located over portion 602. In a manner similar to that described in conjunction with the embodiment of FIG. 8, the present embodiment allows one to readily measure the critical dimension (by examining via 902, for example); readily determine whether the via has been etched to a minimum desired depth; and readily determine whether or not the via location and formation process is accurately locating the vias as intended.

Figure 10:
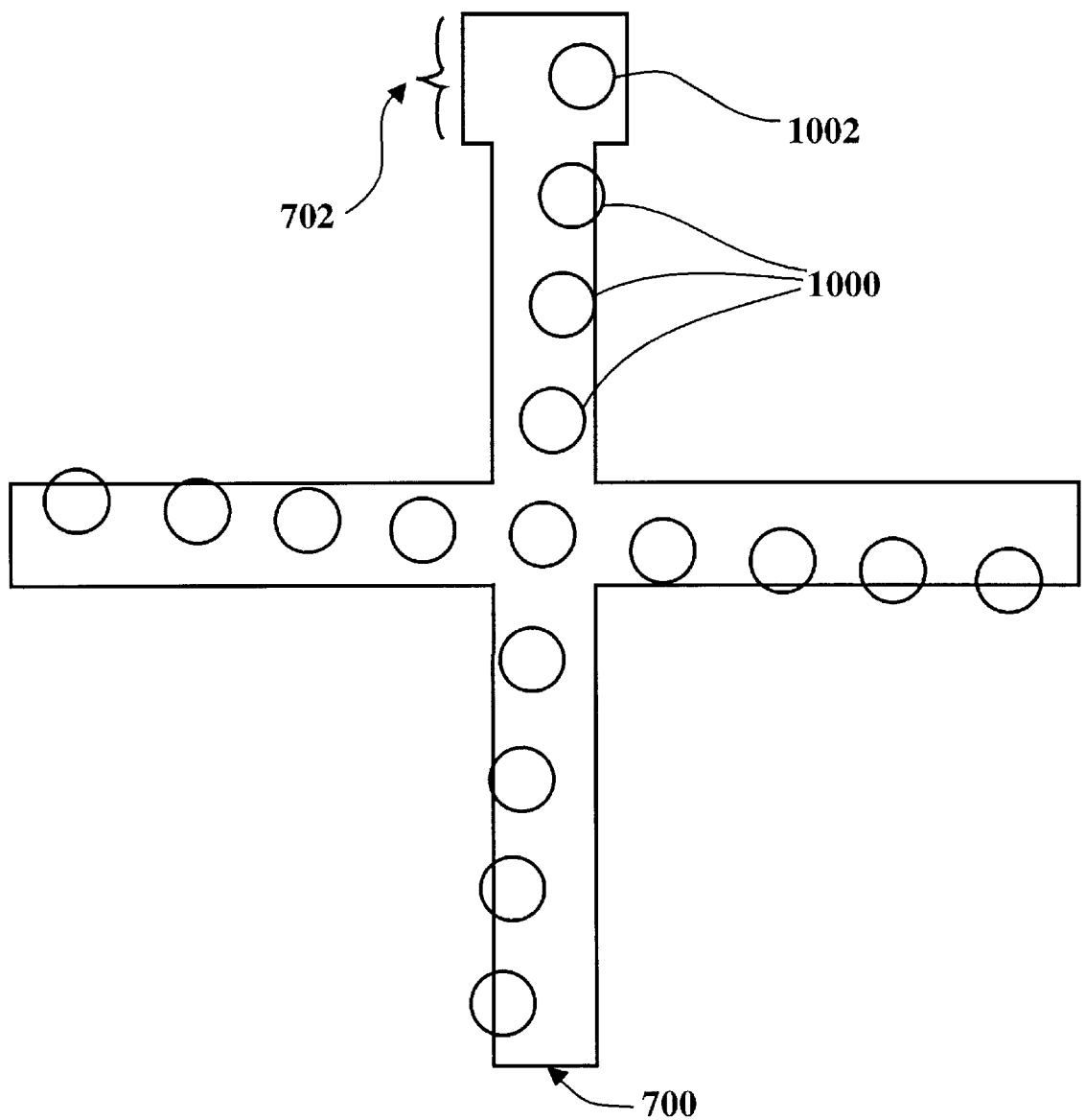
FIG. 10 is top plan view of the sample structure of FIG. 8 having a plurality of vias formed thereover in accordance with the present claimed invention.

With reference now to FIG. 10, a top side plan view of the sample structure of FIG. 7 is shown having a plurality of vias disposed thereover. In FIG. 10, each of the circles, typically shown as 1000, represents the location where a test via is to be formed. As shown in FIG. 10, in the present embodiment, sample structure 700 includes a portion 802 having a diameter greater than the diameter of the test vias. (Portion 702 is also shown in FIG. 7.) In so doing, the present embodiment ensures that sample structure 700 will completely underlie a via (e.g. via 1002) located over portion 702. In a manner similar to that described in conjunction with the embodiment of FIG. 8, the present embodiment allows one to readily measure the critical dimension (by examining via 1002, for example); readily determine whether the via has been etched to a minimum desired depth; and readily determine whether or not the via location and formation process is accurately locating the vias as intended.

Hence, the present invention provides an apparatus and method for simultaneously determining various parameters of a via formed into a material in a single inspection step. Furthermore, the present invention provides an apparatus and method for measuring the critical dimension of a via wherein the apparatus and method is feasible even for a via having a critical dimension of less than approximately 0.6 microns and an aspect ratio>1:1. The present invention also provides a via formation apparatus and method which readily indicates whether a via has been formed at least to a desired depth into the underlying dielectric material. The present invention further provides an apparatus and method which determines the degree of misalignment present in the formation of a via.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, and to thereby enable others skilled in the art best to utilize the invention and various embodiments with various modifications as are suited to the particular use contemplated. It is intended that the scope of the invention be defined by the claims appended hereto and their equivalents.

What is claimed is:

1. A test device for determining the parameters of a test via formed into a dielectric material, said test device comprising:

electron accumulating conductive structure means for improving a scanning electron microscope image of a test via to be formed above said conductive structure, said electron accumulating conductive structure disposed within said dielectric material through which said test via is to be formed, said electron accumulating conductive structure disposed within said dielectric material through which said test via is to be formed such that a top surface of said electron accumulating conductive structure is disposed at a depth which is at least as great as an intended depth of said test via, and said electron accumulating conductive structure is electrically isolated such that there is no direct path to ground potential, wherein said electron accumulating conductive structure is further comprised of a multiple layer of electrically isolated conductive materials with no dielectric between said multiple layers.

2. The test device of claim 1 wherein said electron accumulating conductive structure means is cross shaped.

3. The test device of claim 2 wherein said electron accumulating conductive structure means includes a portion having a diameter at least three times greater than the diameter of said test via.

4. A test device for determining parameters of a plurality of test vias formed into a dielectric material, said test device comprising:

electron accumulating conductive structure means for improving a scanning electron microscope image of a plurality of test vias to be formed above said electron accumulating conductive structure, said electron accumulating conductive structure disposed within said dielectric material through which said plurality of test vias are to be formed, said electron accumulating conductive structure is electrically isolated such that there is no direct path to ground potential, said electron accumulating conductive structure disposed within said dielectric material through which said plurality of test vias are to be formed such that a top surface of said electron accumulating conductive structure is disposed at a depth which is at least as great as the intended depth of said plurality of test vias, said plurality of test vias to be formed disposed intentionally offset with respect to said electron accumulating conductive structure such that secondary electrons repelled from said electron accumulating conductive structure characterize a degree of alignment of said plurality of test vias with respect to said electron accumulating conductive structure, wherein said electron accumulating conductive structure is further comprised of a multiple layer of electrically isolated conductive materials with no dielectric between said multiple layers.

5. The test device of claim 4 wherein said electron accumulating conductive structure means is cross shaped.

6. The test device of claim 5 wherein said electron accumulating conductive structure means includes a portion having a diameter greater than the diameter of said plurality of test vias.

* * * * *